(12) United States Patent
Forbes

(10) Patent No.: US 8,354,311 B2
(45) Date of Patent: Jan. 15, 2013

(54) METHOD FOR FORMING NANOFIN TRANSISTORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 622 days.

(21) Appl. No.: 11/397,358

(22) Filed: Apr. 4, 2006

(65) Prior Publication Data

US 2007/0231980 A1      Oct. 4, 2007

(51) Int. Cl.
H01L 21/84      (2006.01)
H01L 21/00      (2006.01)

(52) U.S. Cl. ........ 438/157; 438/197; 438/211; 438/212; 438/301; 257/401; 257/E21.409; 257/E21.629

(58) Field of Classification Search ................... 438/157
See application file for complete search history.

(56) References Cited

U.S. PATENT DOCUMENTS

| | | |
|---|---|---|
| 4,941,026 A | 7/1990 | Temple |
| 5,013,680 A | 5/1991 | Lowrey et al. |
| 5,646,900 A | 7/1997 | Tsukude et al. |
| 5,909,618 A | 6/1999 | Forbes et al. |
| 5,982,162 A | 11/1999 | Yamauchi |
| 6,063,688 A | 5/2000 | Doyle et al. |
| 6,097,065 A | 8/2000 | Forbes et al. |
| 6,104,061 A | 8/2000 | Forbes et al. |
| 6,104,068 A | 8/2000 | Forbes |
| 6,150,687 A | 11/2000 | Noble et al. |
| 6,177,299 B1 | 1/2001 | Hsu et al. |
| 6,191,448 B1 | 2/2001 | Forbes et al. |
| 6,238,976 B1 | 5/2001 | Noble et al. |
| 6,320,222 B1 | 11/2001 | Forbes et al. |
| 6,350,635 B1 | 2/2002 | Noble et al. |
| 6,355,961 B1 | 3/2002 | Forbes |
| 6,376,317 B1 | 4/2002 | Forbes et al. |

(Continued)

FOREIGN PATENT DOCUMENTS

DE      19943390      5/2001

(Continued)

OTHER PUBLICATIONS

Adler, E., et al., "The Evolution of IBM CMOS DRAM Technology", *IBM Journal of Research & Development*, 39(1-2), (Jan.-Mar. 1995),167-188.

(Continued)

*Primary Examiner* — Olik Chaudhuri
*Assistant Examiner* — Walter H Swanson
(74) *Attorney, Agent, or Firm* — Schwegman, Lundberg & Woessner, P.A.

(57) ABSTRACT

One aspect of the present subject matter relates to a method for forming a transistor. According to an embodiment, a fin is formed from a crystalline substrate. A first source/drain region is formed in the substrate beneath the fin. A surrounding gate insulator is formed around the fin. A surrounding gate is formed around the fin and separated from the fin by the surrounding gate insulator. A second source/drain region is formed in a top portion of the fin. Various embodiments etch a hole in a layer over the substrate, form sidewall spacers in the hole, form a fin pattern from the sidewall spacers, and etch into the crystalline substrate to form the fin from the substrate using a mask corresponding to the fin pattern. Other aspects are provided herein.

19 Claims, 13 Drawing Sheets

U.S. PATENT DOCUMENTS

| | | | |
|---|---|---|---|
| 6,377,070 | B1 | 4/2002 | Forbes |
| 6,399,979 | B1 | 6/2002 | Noble et al. |
| 6,413,802 | B1 | 7/2002 | Hu et al. |
| 6,413,825 | B1 | 7/2002 | Forbes |
| 6,414,356 | B1 | 7/2002 | Forbes et al. |
| 6,424,001 | B1 | 7/2002 | Forbes et al. |
| 6,448,601 | B1 | 9/2002 | Forbes et al. |
| 6,492,233 | B2 | 12/2002 | Forbes et al. |
| 6,496,034 | B2 | 12/2002 | Forbes et al. |
| 6,504,201 | B1 | 1/2003 | Noble et al. |
| 6,531,727 | B2 | 3/2003 | Forbes et al. |
| 6,559,491 | B2 | 5/2003 | Forbes et al. |
| 6,566,682 | B2 | 5/2003 | Forbes |
| 6,639,268 | B2 | 10/2003 | Forbes et al. |
| 6,649,476 | B2 | 11/2003 | Forbes |
| 6,653,174 | B1 | 11/2003 | Cho et al. |
| 6,664,806 | B2 | 12/2003 | Forbes et al. |
| 6,720,216 | B2 | 4/2004 | Forbes |
| 6,747,313 | B1 | 6/2004 | Gil |
| 6,762,448 | B1 | 7/2004 | Lin et al. |
| 6,801,056 | B2 | 10/2004 | Forbes |
| 6,818,937 | B2 | 11/2004 | Noble et al. |
| 6,855,582 | B1 | 2/2005 | Dakshina-Murthy et al. |
| 6,881,627 | B2 | 4/2005 | Forbes et al. |
| 6,890,812 | B2 | 5/2005 | Forbes et al. |
| 6,894,532 | B2 | 5/2005 | Forbes et al. |
| 6,903,367 | B2 | 6/2005 | Forbes |
| 6,946,879 | B2 | 9/2005 | Forbes |
| 6,964,903 | B2 | 11/2005 | Forbes |
| 7,120,046 | B1 | 10/2006 | Forbes |
| 7,326,611 | B2 | 2/2008 | Forbes |
| 7,371,627 | B1 | 5/2008 | Forbes |
| 7,425,491 | B2 | 9/2008 | Forbes et al. |
| 7,439,576 | B2 | 10/2008 | Forbes |
| 7,446,372 | B2 | 11/2008 | Forbes |
| 7,491,995 | B2 | 2/2009 | Forbes |
| 2002/0028541 | A1 | 3/2002 | Lee et al. |
| 2002/0060338 | A1 | 5/2002 | Zhang |
| 2002/0177265 | A1 | 11/2002 | Skotnicki |
| 2003/0006410 | A1 | 1/2003 | Doyle |
| 2003/0008515 | A1 | 1/2003 | Chen et al. |
| 2003/0227072 | A1 | 12/2003 | Forbes |
| 2004/0007721 | A1 | 1/2004 | Forbes et al. |
| 2004/0108545 | A1 | 6/2004 | Ando |
| 2004/0174734 | A1 | 9/2004 | Forbes |
| 2004/0217391 | A1 | 11/2004 | Forbes |
| 2004/0219722 | A1 | 11/2004 | Pham et al. |
| 2004/0235243 | A1 | 11/2004 | Noble et al. |
| 2005/0023616 | A1 | 2/2005 | Forbes |
| 2005/0032297 | A1 | 2/2005 | Kamins |
| 2005/0190617 | A1 | 9/2005 | Forbes |
| 2006/0043471 | A1 | 3/2006 | Tang et al. |
| 2006/0046200 | A1* | 3/2006 | Abatchev et al. ............ 430/313 |
| 2006/0046391 | A1 | 3/2006 | Tang et al. |
| 2006/0046424 | A1 | 3/2006 | Chance et al. |
| 2006/0063350 | A1 | 3/2006 | Chance et al. |
| 2006/0076625 | A1 | 4/2006 | Lee et al. |
| 2006/0258119 | A1 | 11/2006 | Wells |
| 2006/0278910 | A1 | 12/2006 | Forbes |
| 2007/0018206 | A1 | 1/2007 | Forbes |
| 2007/0052012 | A1 | 3/2007 | Forbes |
| 2007/0082448 | A1 | 4/2007 | Kim et al. |
| 2007/0228433 | A1 | 10/2007 | Forbes |
| 2007/0228491 | A1 | 10/2007 | Forbes |
| 2007/0231985 | A1 | 10/2007 | Forbes |
| 2007/0232007 | A1 | 10/2007 | Forbes |
| 2008/0315279 | A1 | 12/2008 | Forbes |
| 2009/0155966 | A1 | 6/2009 | Forbes |
| 2010/0330759 | A1 | 12/2010 | Forbes |

FOREIGN PATENT DOCUMENTS

| | | |
|---|---|---|
| DE | 19943390 A1 | 5/2001 |
| TW | I344181 | 6/2011 |
| WO | WO-2005/079182 A2 | 9/2005 |
| WO | WO-2005079182 A2 | 9/2005 |
| WO | WO-2005079182 A3 | 9/2005 |
| WO | WO-2007114927 A1 | 10/2007 |
| WO | WO-2007120492 A1 | 10/2007 |
| WO | WO-2007120493 A1 | 10/2007 |
| WO | WO-2007136461 A2 | 11/2007 |
| WO | WO-2007136461 A3 | 11/2007 |

OTHER PUBLICATIONS

Bryllert, Tomas, et al., "Vertical high mobility wrap-gated InAs nanowire transistor", *IEEE Device Research Conference*, Santa Barbara, CA,(Jun. 2005),157-158.

Cho, Hyun-Jin, et al., "A Novel Pillar DRAM Cell for 4Gbit and Beyond", *1998 Symposium on VLSI Technology Digest of Technical Papers*, Jun. 9-11, 1998,38-39.

Denton, Jack P., et al., "Fully depleted dual-gated thin-film SOI P-MOSFETs fabricated in SOI islands with an isolated buried polysilicon backgate", *IEEE Electon Device Letters*, 17(11),(Nov. 1996),509-511.

Doyle, B. S., et al., "High performance fully-depleted tri-gate CMOS transistors", *IEEE Electron Device Letters*, vol. 24, No. 4, (Apr. 2003),263-265.

Doyle, B. S., et al., "Tri-Gate fully-depleted CMIS transistors: fabrication, design and layout", *2003 Symposium on VLSI Technology Digest of Technical Papers*, Kyoto, Japan, Jun. 10-12, 2003,133-134.

Forbes, Leonard, "DRAM Arrays, Vertical Transistor Stuctures and Methods of Forming Transistor Structures and DRAM Arrays", U.S. Appl. No. 11/051,119, filed Feb. 3, 2005 (Client Ref. No. 04-0915), 52 pgs.

Forbes, Leonard, "DRAM Tunneling Access Transistor", U.S. Appl. No. 11/219,085, filed Aug. 29, 2005 (Client Ref. No. 05-0676), 31 pgs.

Forbes, Leonard, "DRAM with Nanofin Transistors", (Client Ref. No. 05-1042), 48 pgs.

Forbes, Leonard, "Grown Nanofin Transistors", (Client Ref. No. 05-1023), 37 pgs.

Forbes, Leonard, "Memory Array With Surrounding Gate Access Transistors and Capacitors With Global and Staggered Local Bit Lines", U.S. Appl. No. 11/128,585, filed May 13, 2005 (Client Ref. No. 04-1029), 42 pgs.

Forbes, Leonard, "Memory Array With Ultra-Thin Etched Pillar Surround Gate Access Transistors and Buried Data/Bit Lines", U.S. Appl. No. 11/129,502, filed May 13, 2005 (Client Ref. No. 04-1007), 33 pgs.

Forbes, Leonard, "Nanowire Transistor With Surrounding Gate", (Client Ref. No. 05-1017), 37 pgs.

Forbes, Leonard, "Surround Gate Access Transistors With Grown Ultra-Thin Bodies", U.S. Appl. No. 11/175,677, filed Jul. 6, 2005 (Client Ref. No. 4-0962), 28 pgs.

Forbes, Leonard, "Tunneling Transistor With Sublithographic Channel", (Client Ref. No. 05-1077), 63 pgs.

Forbes, Leonard, "Ultra-Thin Body Vertical Tunneling Transistor", U.S. Appl. No. 11/215,468, filed Aug. 29, 2005 (Client Ref. No. 05-0664), 27 pgs.

Forbes, Leonard, "Vertical Transistor Memory Cell, Device, System and Method of Forming Same", U.S. Appl. No. 11/151,219, filed Jun. 13, 2005 (Client Ref. No. 04-0853), 39 pgs.

Forbes, Leonard, "Vertical Tunneling Nano-Wire Transistor", U.S. Appl. No. 11/210,374, filed Aug. 24, 2005 (Client Ref. No. 5-0654), 26 pgs.

Huang, Xuejue, et al., "Sub-50 nm P-Channel FinFET", *IEEE Transactions on Electron Devices*, vol. 48, No. 5, (May 2001),800-886.

Kalavade, Pranav, et al., "A novel sub-10 nm transistor", *58th DRC. Device Research Conference, Conference Digest*, (Jun. 19-21, 2000),71-72.

Kedzierski, Jakub, et al., "Threshold voltage control in NiSi-gated MOSFETs through silicidation induced impurity segregation (SIIS)", *IEDM Tech. Dig.*, (2003),315-318.

Kim, Keunwoo, et al., "Nanoscale CMOS Circuit Leakage Power Reduction by Double-Gate Device", *International Symposium on Low Power Electronics and Design*, Newport, CA, Aug. 9-11, 2004; http://www.islped.org,(2004),102-107.

Lee, Choonsup, et al., "A Nanochannel Fabrication Technique without Nanolithography", *Nano Letters*, vol. 3, No. 10, (2003),1339-1340.

Miyano, Shinji et al., "Numerical Analysis of a Cylindrical Thin-Pillar Transistor (CYNTHIA)", *IEEE Transactions on Electron Devices*, vol. 39, No. 8, (Aug. 1992),1876-1881.

Nirschl, TH., et al., "The Tunneling Field Effect Transistor (TFET) as an Add-on for Ultra-Low-Voltage Analog and Digital Processes", *IEEE International Electron Devices Meeting, 2004; IEDM Technical Digest*, (Dec. 13-15, 2004),195- 198.

Rahman, Anisur, et al., "Theory of Ballistic Nanotransistors", *IEEE Transactions on Electron Devices*, vol. 50, No. 9, (Sep. 2003),1853-1864.

Samuelson, Lars, "Semiconductor Nanowires as a Novel Electronic Materials Technology for Future Electronic Devices", *IEEE Device Research Conference*, Santa Barbara, CA,(Jun. 2005),245.

Samuelson, L., et al., "Semiconductor nanowires for 0D and 1D physics and applications", *Physica E 25*, (Jul. 27, 2004),313-318.

Shimomura, K., et al., "A 1-V 46-ns 16-Mb SOI-DRAM with body control technique", *IEEE Journal of Solid-State Circuits*, 32(11), (Nov. 1997),1712-1720.

Shimomura, K., et al., "A 1V 46ns 16Mb SOI-DRAM with Body Control Technique", *1997 IEEE International Solid-State Circuits Conference, Diciest of Technical Papers*, (Feb. 6, 1997),68-69.

Takato, H., et al., "High Performance CMOS Surrounding Gate Transistor (SGT) for Ultra High Density LSIs", *IEEE International Electron Devices Meeting, Technical Digest*, (1988),222-225.

Wong, Hon-Sum P., et al., "Self-Aligned (Top and Bottom) Double-Gate MOSFET with a 25 nm Thick Silicon Channel", *IEEE Int. Electron Device Meeting*, (1997),427-430.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000),67-68.

Ziegler, James F., et al., "Cosmic Ray Soft Error Rates of 16-Mb DRAM Memory Chips", *IEEE Journal of Solid-State Circuits*, vol. 33, No. 2, (Feb. 1998),246-252.

U.S. Appl. No. 11/397,406, Response filed Nov. 19, 2007 Restriction Requirement mailed Oct. 18, 2007, 9 pgs.

U.S. Appl. No. 11/397,413, Response filed Nov. 5, 2007 Preliminary Amendment and Restriction Requirement mailed Oct. 5, 2007, 11 pgs.

U.S. Appl. No. 11/397,413, Restriction Requirment mailed Oct. 5, 2007, 6 pgs.

U.S. Appl. No. 11/397,527, Non-Final Office Action mailed Jul. 24, 2007, 17 pgs.

U.S. Appl. No. 11/397,527, Response filed Oct. 24, 2007 to Non-Final Office Action mailed Jul. 24, 2007, 16 pgs.

U.S. Appl. No. 11/397,527, Response filed May 25, 2007 Restriction Requirement mailed Apr. 27, 2007, 11 pgs.

U.S. Appl. No. 11/397,527, Restriction Requirement mailed Apr. 27, 2007, 5 pgs.

PCT Application No. PCT/US2007008400 Search Report, (Sep. 18, 2007),4 pgs.

PCT Application No. PCT/US2007/008400 Written Opinion, (Sep. 18, 2007),6 pgs.

"Chinese Application No. 200780011164.2, Office Action issued Oct. 23, 2009 and received Nov. 26, 2009", 5 pgs.

"Chinese Application No. 200780011084.7, Office Action issued Aug. 14, 2009", 8 pgs.

Mitsutoshi, et al., "Excimer laser annealing of amorphous and solid-phase-crystallized silicon films.", *Journal of Applied Physics*, vol. 86, No. 10, (Nov. 15, 1999.), 10 pgs.

"China Application Serial No. 200780012174.8, Office Action mailed Mar. 1, 2010", 8 pgs.

"http://web.archive.org/web/20020211230307/http://britheyspears.aclphysics/fabrication/photolithog raphy.htm", (Feb. 11, 2002), 3 pgs.

"European Application Serial No. 07754850.1, Office Action Mailed May 25, 2010", 6 pgs.

"Chinese Application Serial No. 200780011084.7, Office Action mailed Sep. 26, 2010".

"Chinese Application Serial No. 200780012174.8, Office Action mailed Dec. 3, 2010".

"European Application Serial No. 07754850.1, Office Action Response mailed Nov. 17, 2010".

"Taiwan Application Serial No. 096112121, Office Action mailed Dec. 24, 2010".

"Taiwan Application Serial No. 96112122, Office Action mailed Sep. 17, 2010".

"Taiwan Application Serial No. 96112122, Office Action Response filed Jan. 6, 2011".

"Taiwan Application Serial No. 96112125, Office Action mailed Dec. 2, 2010".

"Chinese Application Serial No. 200780012174.8, Office Action mailed Mar. 30, 2011", 4 pgs.

"European Application Serial No. 07754621.6, Response filed May 16, 2011 to Examination Notification Art. 94(3) mailed Feb. 4, 2011", 7 pgs.

"European Application Serial No. 07809002.4, Response filed May 23, 2011 to Examination Notification Art. 94(3) mailed Feb. 4, 2011", 11 pgs.

"European Application Serial No. 07754850.1, Office Action mailed Jun. 9, 2011", 5.

"Taiwan Application Serial No. 96112124, Notice of Allowance mailed Jul. 13, 2011", 2.

"Taiwanese Application Serial No. 096112121, Office Action mailed Apr. 7, 2011", Notification letter, 2 pgs.

"Taiwanese Application Serial No. 96112122, Notice of Allowance mailed Mar. 8, 2011", 2 pgs.

"Taiwanese Application Serial No. 96112125, Response filed Jun. 6, 2011 to Office Action mailed Dec. 2, 2010", 33 pgs.

"Chinese Application No. 200780011084.7, Amendment filed Jan. 16, 2011", (with English translation of amended claims), 13 pgs.

"Chinese Application Serial No. 200780011164.2, Amendment filed Jan. 17, 2010", (with English translation of amended claims), 16 pgs.

"Chinese Application Serial No. 200780012174.8, Office Action response filed Jan. 28, 2011", (with English translation of amended claims), 12 pgs.

"Chinese Application No. 200780012174.8, Response filed Feb. 10, 2011", (with English translation of amended claims), 13 pgs.

"European Application Serial No. 07754621.6, Examination Notification Art. 94(3) mailed Feb. 4, 2011", 5 Pgs.

"European Application Serial No. 07809002.4, Examination Notification Art. 94(3) mailed Feb. 4, 2011", 5 pgs.

"Japanese Application Serial No. 2009-504232, Amendment filed Mar. 31, 2010", (with English translation of amended claims), 16 pgs.

"Japanese Application Serial No. 2009-504238, Voluntary Amendment filed Mar. 24, 2010", (with English translation of amended claims), 17 pgs.

"Japanese Application Serial No. 2009-504280, Amendment filed Mar. 31, 2010", (with English translation of amended claims), 15 pgs.

\* cited by examiner

US 8,354,311 B2

METHOD FOR FORMING NANOFIN TRANSISTORS

CROSS REFERENCE TO RELATED APPLICATIONS

This application is related to the following commonly assigned U.S. patent applications which are filed on even date herewith and are herein incorporated by reference in their entirety: "Nanowire Transistor With Surrounding Gate," U.S. application Ser. No. 11/397,527, filed on Apr. 4, 2006; "Grown Nanofin Transistors," U.S. application Ser. No. 11/397,430, filed on Apr. 4, 2006; "DRAM With Nanofin Transistors," U.S. application Ser. No. 11/397,413, filed on Apr. 4, 2006; and "Tunneling Transistor With Sublithographic Channel," U.S. application Ser. No. 11/397,406, filed on Apr. 4, 2006.

TECHNICAL FIELD

This disclosure relates generally to semiconductor devices, and more particularly, to nanofin transistors.

BACKGROUND

The semiconductor industry has a market driven need to reduce the size of devices, such as transistors, and increase the device density on a substrate. Some product goals include lower power consumption, higher performance, and smaller sizes. FIG. 1 illustrates general trends and relationships for a variety of device parameters with scaling by a factor k. The continuous scaling of MOSFET technology to the deep submicron region where channel lengths are less than 0.1 micron (100 nm or 1000 Å) causes significant problems in the conventional transistor structures. For example, junction depths should be much less than the channel length. Thus, with reference to the transistor 100 illustrated in FIG. 1, the junctions depths 101 should be on the order of a few hundred Angstroms for channels lengths 102 that are approximately 1000 Å long. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus, the expected improved performance attributed to a shorter channel is negated by the lower carrier mobility and higher leakage attributed to the higher doping.

Leakage current is a significant issue in low voltage and lower power battery-operated CMOS circuits and systems, and particularly in DRAM circuits. The threshold voltage magnitudes are small to achieve significant overdrive and reasonable switching speeds. However, as illustrated in FIG. 2, the small threshold results in a relatively large sub-threshold leakage current.

Some proposed designs to address this problem use transistors with ultra-thin bodies, or transistors where the surface space charge region scales as other transistor dimensions scale down. Dual-gated or double-gated transistor structures also have been proposed to scale down transistors. As commonly used in the industry, "dual-gate" refers to a transistor with a front gate and a back gate which can be driven with separate and independent voltages, and "double-gated" refers to structures where both gates are driven when the same potential. An example of a double-gated device structure is the FinFET. "TriGate" structures and surrounding gate structures have also been proposed. In the "TriGate" structure, the gate is on three sides of the channel. In the surrounding gate structure, the gate surrounds or encircles the transistor channel. The surrounding gate structure provides desirable control over the transistor channel, but the structure has been difficult to realize in practice.

FIG. 3 illustrates a dual-gated MOSFET with a drain, a source, and front and back gates separated from a semiconductor body by gate insulators, and also illustrates an electric field generated by the drain. Some characteristics of the dual-gated and/or double-gated MOSFET are better than the conventional bulk silicon MOSFETs, because compared to a single gate, the two gates better screen the electric field generated by the drain electrode from the source-end of the channel. The surrounding gate further screens the electric field generated by the drain electrode from the source. Thus, sub-threshold leakage current characteristics are improved, because the sub-threshold current is reduced more quickly as the gate voltage is reduced when the dual-gate and/or double gate MOSFET turns off. FIG. 4 generally illustrates the improved sub-threshold characteristics of dual gate, double-gate, or surrounding gates MOSFETs in comparison to the sub-threshold characteristics of conventional bulk silicon MOSFETs.

FIGS. 5A-C illustrate a conventional FinFET. FIG. 5A illustrates a top view of the FinFET and FIG. 5B illustrates an end view of the FinFET along line 5B-5B. The illustrated FinFET 503 includes a first source/drain region 504, a second source/drain region 505, and a silicon fin 506 extending between the first and second source/drain regions. The silicon fin functions as a transistor body, where the channel between the first and second source/drain regions is horizontal. A gate insulator 507, such as silicon oxide, is formed over the fin, and a gate 508 is formed over the fin after the oxide is formed thereon. The fin of the illustrated conventional FinFET is formed over buried oxide 509. FIG. 5C illustrates a conventional etch technique for fabricating the fin for the FINFET. As illustrated in FIG. 5C, the fin width is defined by photolithography or e-beam lithography and etch. Thus, the fin width is initially a minimum feature size (1 F). The width of the fin is subsequently reduced by oxidation or etch, as illustrated by arrows 510.

SUMMARY

Aspects of the present subject matter use a sidewall spacer technique to etch ultrathin nanofins into a wafer, and fabricate nanofin transistors with surrounding gates using these etched nanofins. Various embodiments etch silicon nanofins in a silicon substrate. The silicon nanofins are used as the body regions of CMOS transistors where both the thickness of the body of the transistor and channel length have dimensions smaller than lithographic dimensions. For example, some embodiments provide ultrathin nanofins with a thickness on the order of 20 nm to 50 nm.

One aspect of the present subject matter relates to a method for forming a transistor. According to an embodiment, a fin is formed from a crystalline substrate. A first source/drain region is formed in the substrate beneath the fin. A surrounding gate insulator is formed around the fin. A surrounding gate is formed around the fin and separated from the fin by the surrounding gate insulator. A second source/drain region is formed in a top portion of the fin. Various embodiments etch a hole in a layer over the substrate, form sidewall spacers in the hole, form a fin pattern from the sidewall spacers, and etch into the crystalline substrate to form the fin from the substrate using a mask corresponding to the fin pattern.

An aspect relates to a transistor. A transistor embodiment includes a crystalline substrate with trenches etched therein to form a crystalline semiconductor fin from the substrate, a first source/drain region formed in the crystalline substrate at a bottom of the fin and a second source/drain region formed in a top portion of the fin to define a vertically-oriented channel region in the fin between the first and second source/drain regions. The transistor also includes a gate insulator formed around the fin, and a surrounding gate formed around and separated from the fin by the gate insulator. The fin has a cross-sectional dimension that is less than a minimum feature size.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Disclosed herein are nanofin transistors, and a fabrication technique in which nanofins are etched into a substrate or wafer and used to make single crystalline nanofin transistors. The following discussion refers to a silicon nanofin embodiment. Those of ordinary skill in the art will understand, upon reading and comprehending this disclosure, how to form nanofins using other semiconductors.

Aspects of the present subject matter provide nanofin transistors with vertical channels, where there is a first source/drain region at the bottom of the fin and a second source/drain region at the top of the fin. FIGS. 6A-6L illustrate a process for forming a nanofin transistor, according to various embodiments of the present subject matter.

Figure 1:
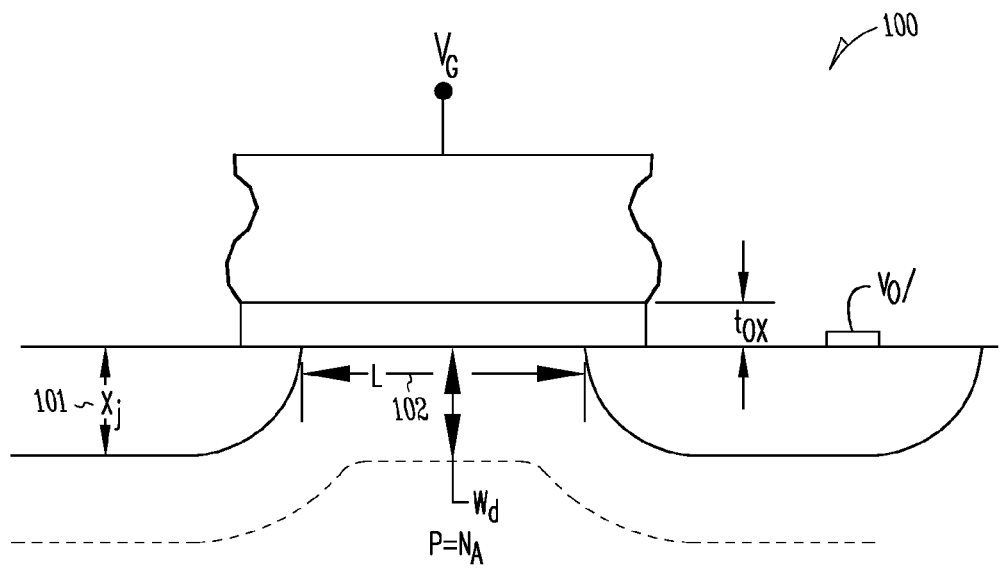
FIG. 1 illustrates general trends and relationships for a variety of device parameters with scaling by a factor k.
Figure 2:
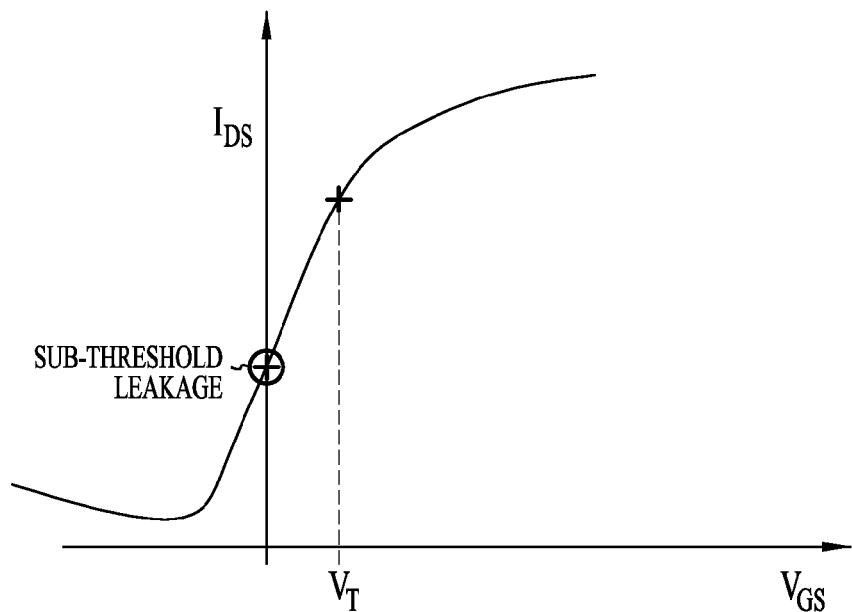
FIG. 2 illustrates sub-threshold leakage in a conventional silicon MOSFET.
Figure 3:
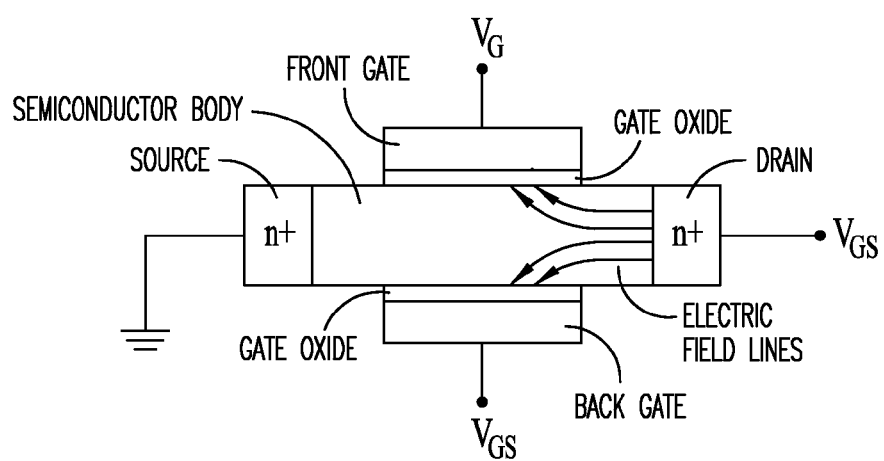
FIG. 3 illustrates a dual-gated MOSFET with a drain, a source, front and back gates separated from a semiconductor body by gate insulators, and an electric field generated by the drain.
Figure 4:
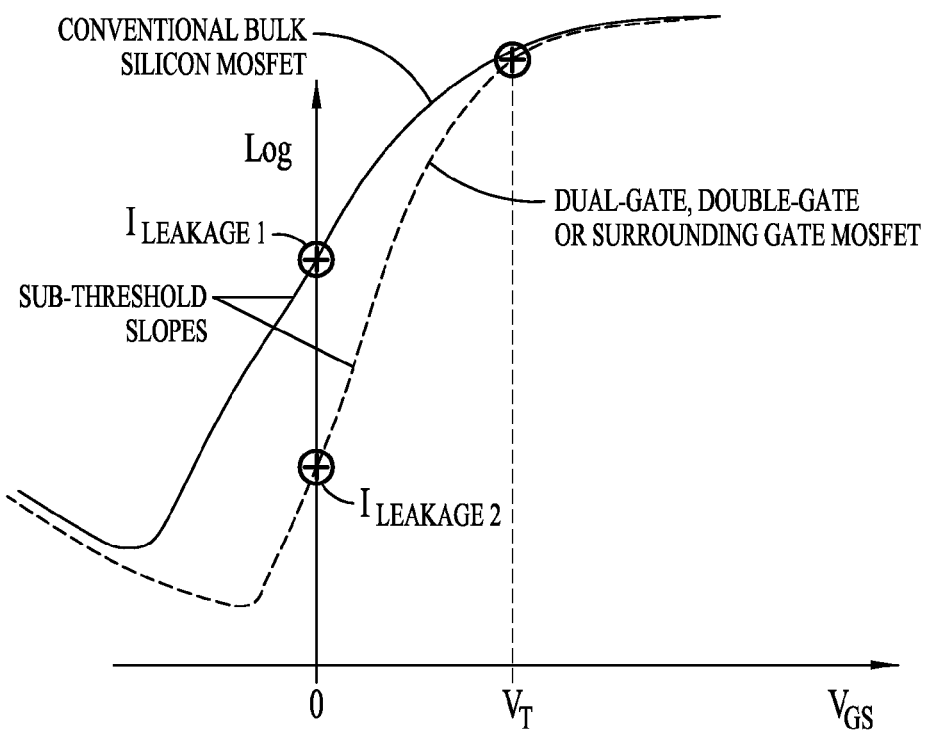
FIG. 4 generally illustrates the improved sub-threshold characteristics of dual gate, double-gate, and surrounding gate MOSFETs in comparison to the sub-threshold characteristics of conventional bulk silicon MOSFETs.
Figure 5A:
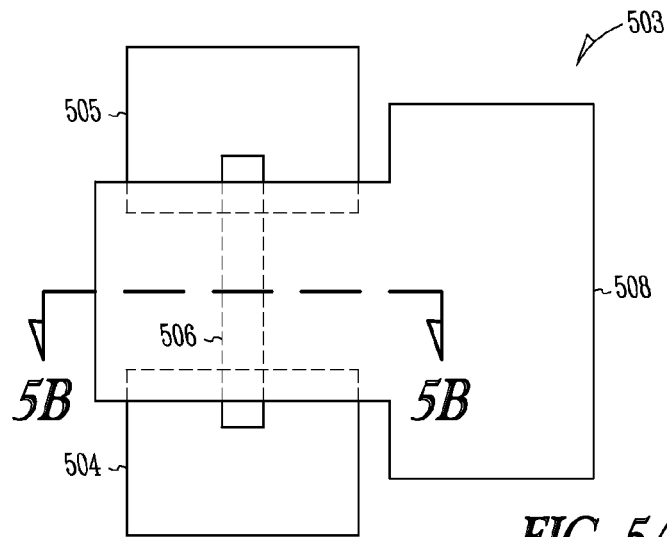
FIGS. 5A-C illustrate a conventional FINFET.
Figure 5B:
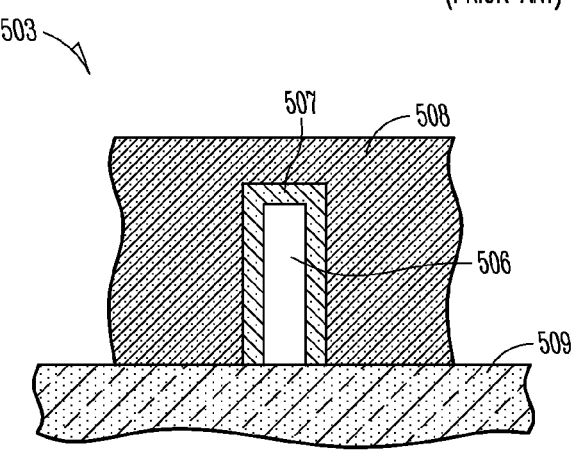
Figure 5C:
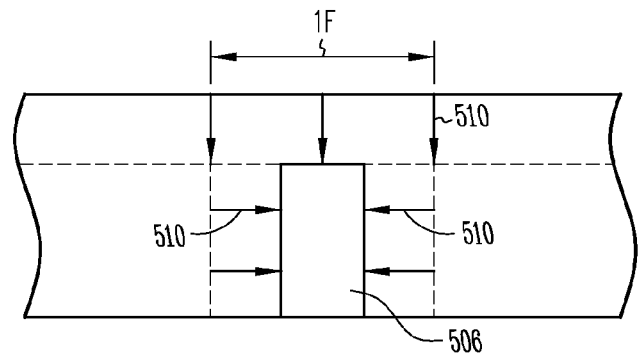
Figure 6A:
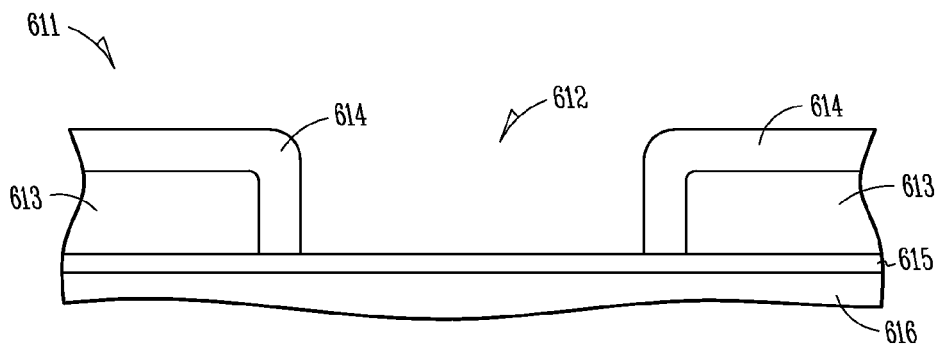
FIGS. 6A-6L illustrate a process for forming a nanofin transistor, according to various embodiments of the present subject matter.
Figure 6B:
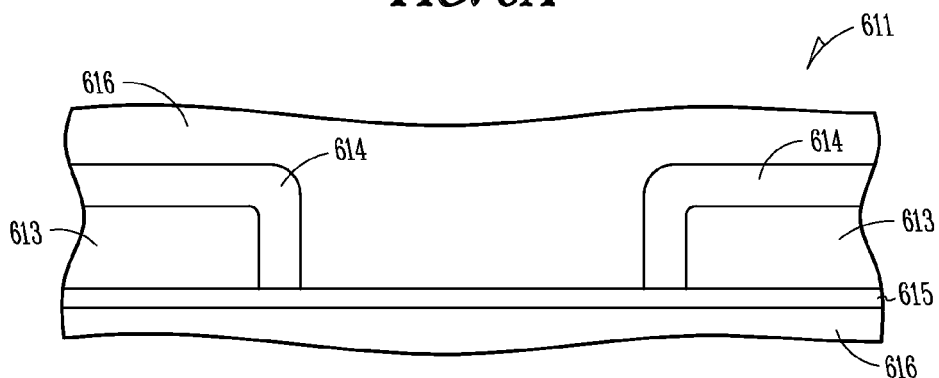
Figure 6C:
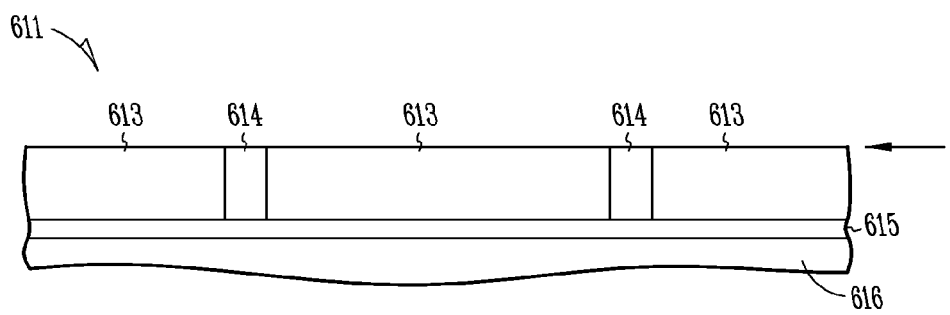

Silicon nitride is deposited on a silicon wafer, and the silicon nitride is covered with a layer of amorphous silicon (a-silicon). FIG. 6A illustrates a side view of the structure 611 after holes 612 are defined in the amorphous silicon 613 and sidewall spacers 614 are formed. The holes 612 extend to the silicon nitride layer 615, which lies over a substrate 616 such as a silicon wafer. Various embodiments form the sidewall spacers by oxidizing the amorphous silicon. FIG. 6B illustrates a side view of the structure 611, after the structure is covered with a thick layer of amorphous silicon 616. FIG. 6C illustrates the structure 611 after the structure is planarized, illustrated by the arrow, at least to a level to remove the oxide on top of the amorphous silicon. The structure can be planarized using a chemical mechanical polishing (CMP) process, for example. This leaves an elongated rectangular pattern, also referred to as a "racetrack" pattern, of oxide 614 exposed on the surface. The width of the pattern lines is determined by the oxide thickness rather than masking and lithography. For example, the oxide thickness can be within a range on the order of 20 nm to 50 nm, according to various embodiments.

Figure 6D:
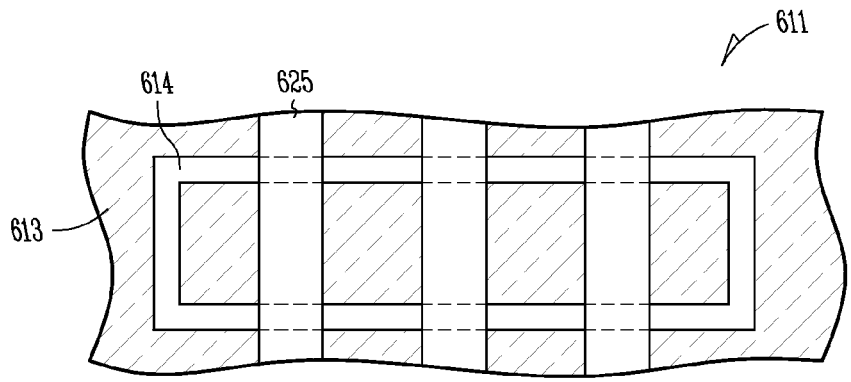
Figure 6E:
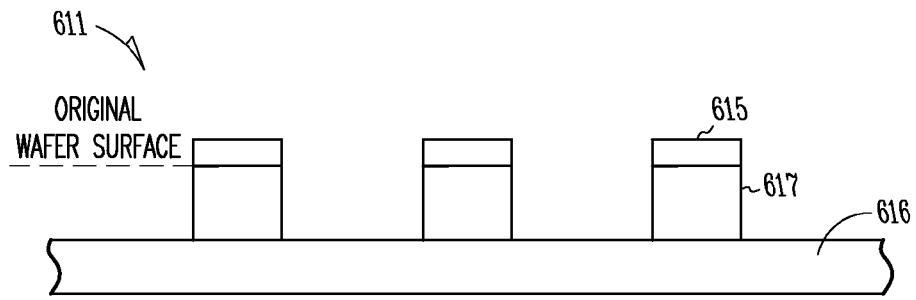
Figure 6F:
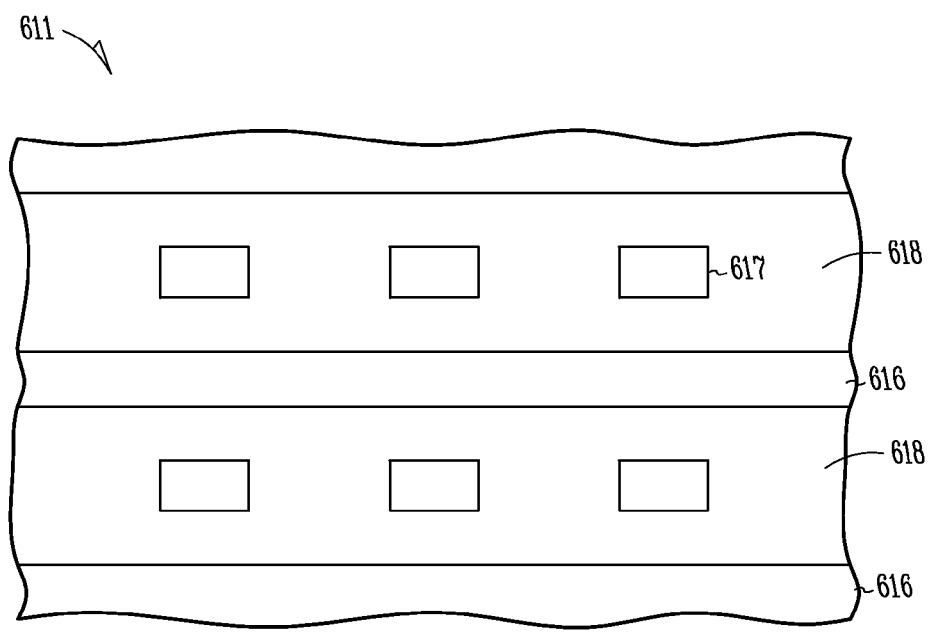
Figure 6G:
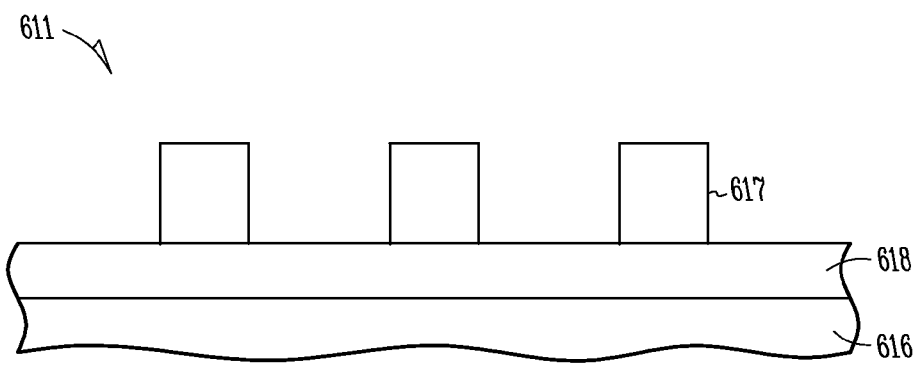

FIG. 6D illustrates a mask (a mask pattern) 625 over the racetrack pattern 614, which selectively covers portions of the oxide and exposes other portions of the oxide. The exposed oxide portions are removed. An etch process, such as a potassium hydroxide (KOH) etch, is performed to remove the amorphous silicon. The oxide, or the portions of the oxide remaining after the mask and etch illustrated in FIG. 6D, protects the nitride during the etch. After the amorphous silicon is removed the nitride 615 can be etched, followed by a directional silicon etch that etches the wafer 616 to a predetermined depth below the nitride layer. The nitride pattern protects the local areas of silicon from the etch, resulting in silicon fins 617 of silicon (an array of sidewall spacers) protruding from the now lower surface of the silicon wafer, as illustrated in FIG. 6E. FIGS. 6F and 6G illustrate top and side views of the structure, after the tops of the fins and trenches at the bottom of the fins are implanted with a dopant. As illustrated in FIG. 6F, the dopant in the trench forms a conductive line 618 (e.g. source line). The dopant also forms a source/drain region at the bottom or a bottom portion of the fin. Because the fins are extremely thin, the doping in the trench is able to diffuse completely under the fins. The strips can be in either the row or column direction.

Figure 6H:
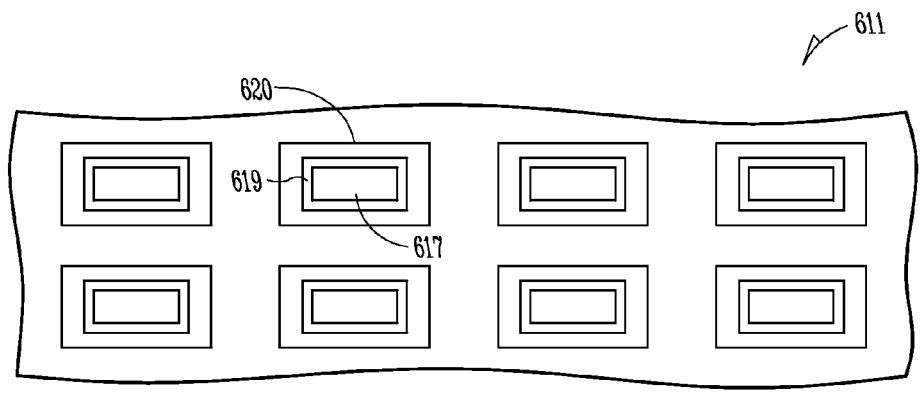

FIG. 6H illustrates the structure 611 after a gate insulator 619 has been formed around the fin 617, and a gate material 620 is formed around and separated from the fin by the gate insulator. For example, an embodiment oxidizes the silicon fins using a thermal oxidation process. The gate material 620 may be polysilicon or metal, according to various embodiments.

Figure 6I:
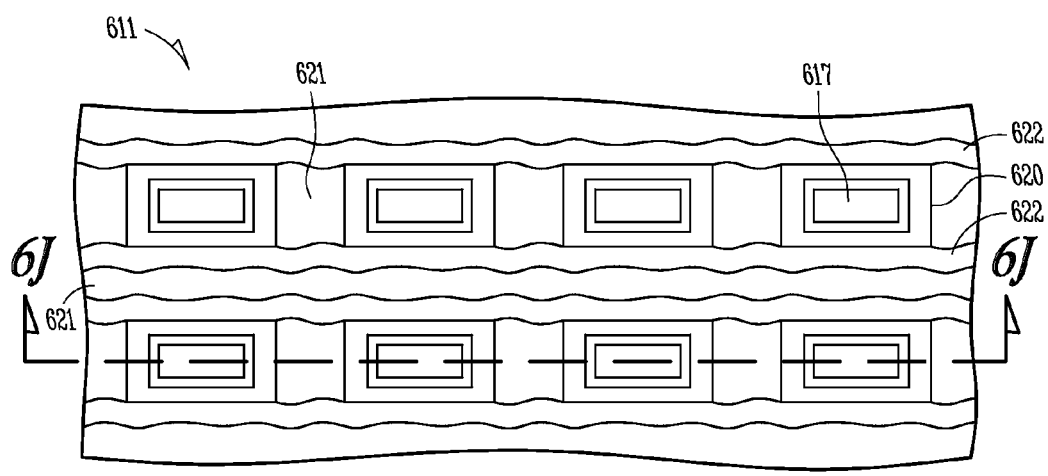
Figure 6J:
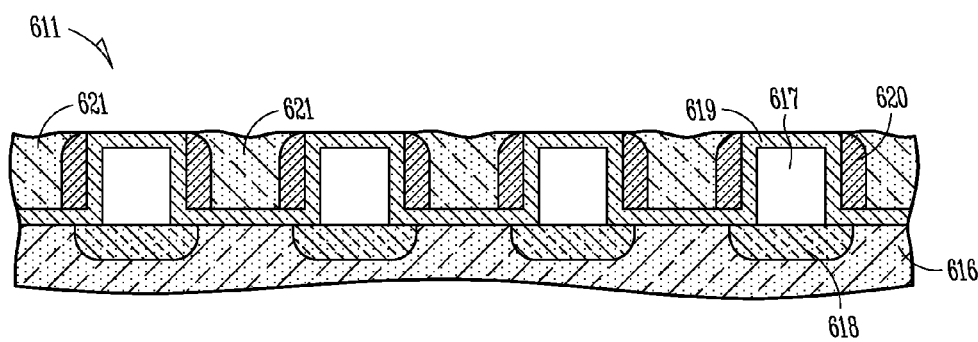

FIGS. 6I and 6J illustrate a top view and a cross-section view along line 6J-6J, respectively, of a first array embodiment. The structure 611 is backfilled with an insulator 621 (e.g. oxide) and trenches are created on the sides of the fins. Gate wiring material 622, such as polysilicon or metal, can be deposited and directionally etched to leave on the sidewalls only and contacting the surrounding gates 620 for the fins. The gate material and gate wiring material can be etched to recess it below the tops of the fins. The whole structure can be again backfilled with oxide and planarized to leave only oxide on the surface. Contact openings and drain doping regions can then be etched to the top of the pillars and drain regions implanted and metal contacts to the drain regions made by conventional techniques. In this case, the metal wiring could run in the "x-direction" and the buried source wiring could run perpendicular to the plane of the paper in the illustration.

Figure 6K:
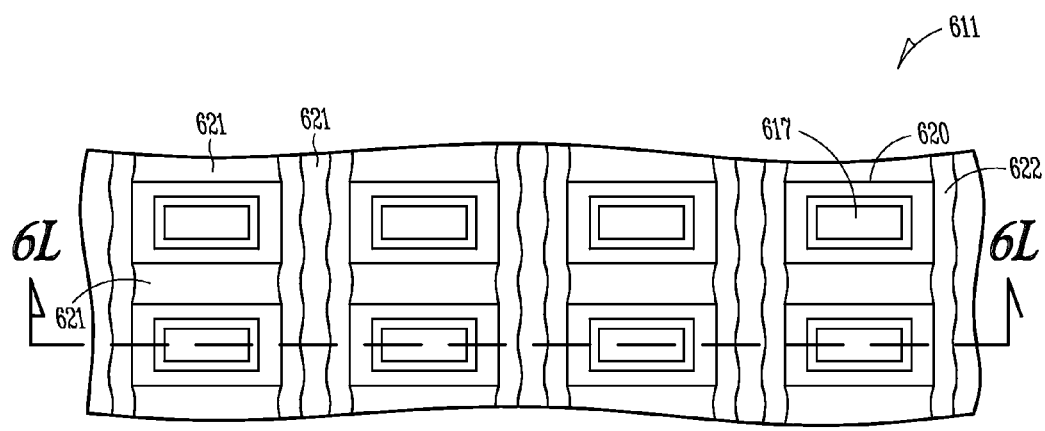
Figure 6L:
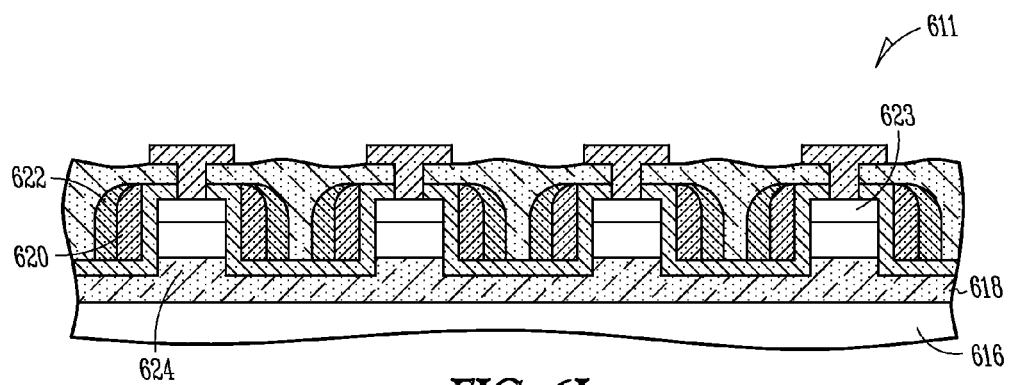

FIGS. 6K and 6L illustrate a top view and a cross-section view along 6L-6L, respectively, of a second array embodiment. The structure 611 is backfilled with an insulator 621 (e.g. oxide) and trenches are created along the side of the fins 617, in the "y-direction". Gate wiring material 622, such as polysilicon or metal, can be deposited and directionally etched to leave on the sidewalls only and contacting the gates on the fins. The gate material and gate wiring material can be etched to recess it below the tops of the fins. The whole structure can be backfilled with an insulator (e.g. oxide) and planarized to leave only oxide on the surface. Contact openings and drain doping regions can then be etched to the top of the pillars and drain regions implanted and metal contacts to the drain regions made by conventional techniques. In this case, the metal wiring could run perpendicular to the plane of the paper in the illustration and the buried source wiring could run in the "x-direction".

In both the first and second array embodiments, the buried source/drains can be implanted before the formation of the surrounding gate insulator and surrounding gate. FIG. 6L illustrates one of the completed fin structures with drain/source regions 623 and 624, recessed gates 620, and source/drain region wiring 618. These nanofin FET's can have a large W/L ratio and will conduct more current than nanowire FET's.

Figure 7:
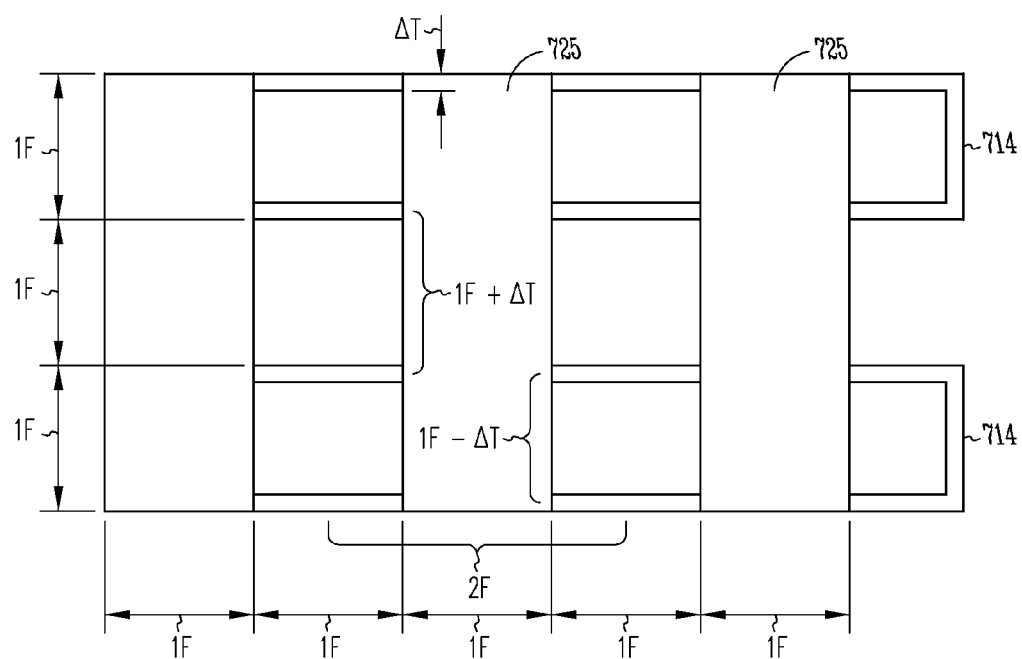
FIG. 7 illustrates a top view of a layout of nanofins for an array of nanofin transistors, according to various embodiments.

FIG. 7 illustrates a top view of a layout of nanofins for an array of nanofin transistors, according to various embodiments. The figure illustrates two "racetracks" of sidewall spacers 714, and further illustrates the portions of the sidewall spacers removed by an etch. The holes used to form the sidewall spacer tracks were formed with a minimum feature size (1 F). The mask strips 725 have a width of a minimum feature size (1 F) and are separated by a minimum feature size (1 F). In the illustrated layout, the columns of the nanofins have an approximately 2 F center-to-center spacing, and the rows of the nanofins have an approximately 1 F center-to-center spacing. Also, as illustrated in FIG. 7, since the nanofins are formed from sidewall spacers on the walls of the holes, the center-to-center spacing between first and second rows will be slightly less than 1 F size by an amount corresponding to the thickness of the nanofins (1 F−ΔT), and the center-to-center spacing between second and third rows will be slightly more than 1 F by an amount corresponding to the thickness of the nanofins (1 F+ΔT). In general, the center-to-center spacing between first and second rows will be slightly less than a feature size interval (NF) by an amount corresponding to the thickness of the nanofins (NF−ΔT), and the center-to-center spacing between second and third rows will be slightly more than a feature size interval (NF) by an amount corresponding to the thickness of the nanofins (NF+ΔT).

Figure 8:
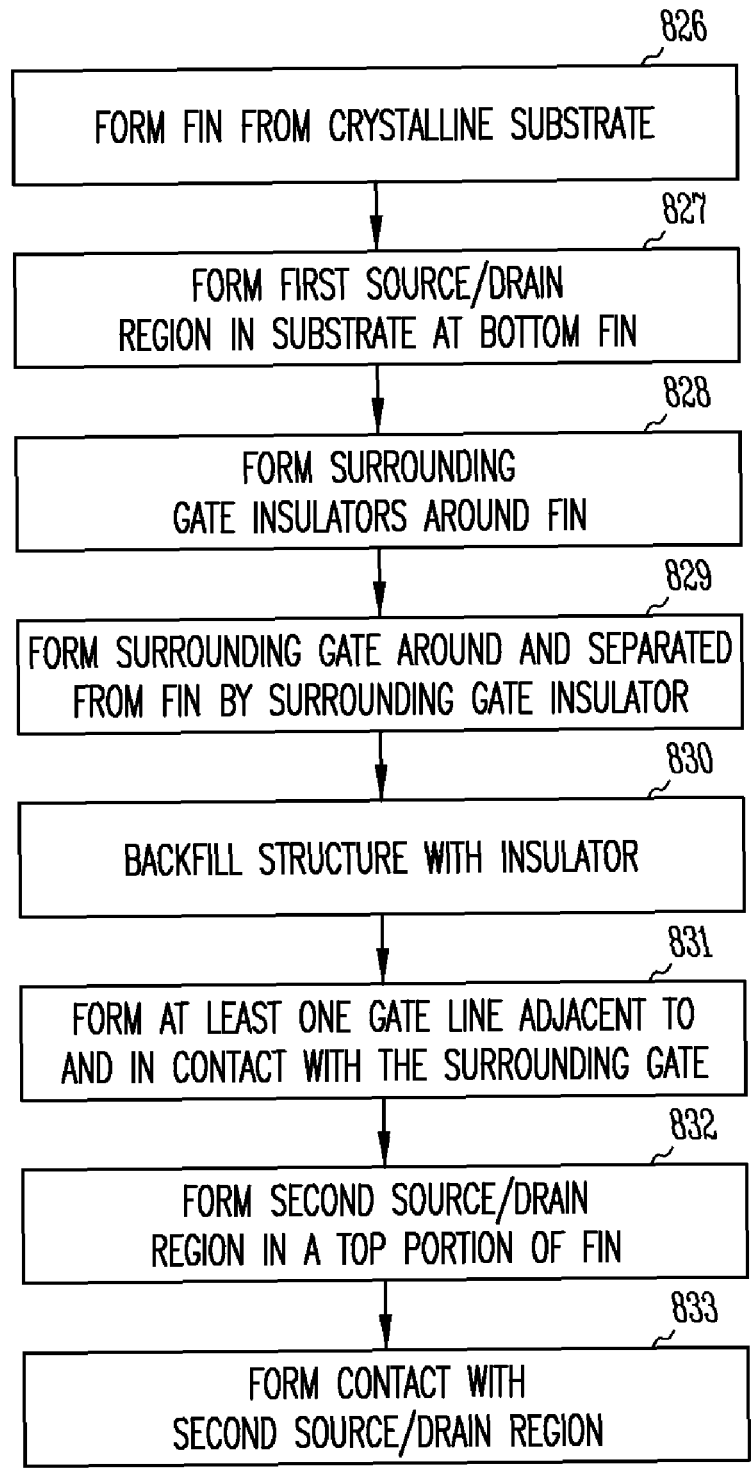
FIG. 8 illustrates a process to fabricate a nanofin transistor, according to various embodiments of the present subject matter.

FIG. 8 illustrates a process to fabricate a nanofin transistor, according to various embodiments of the present subject matter. At 826, a fin is formed from a crystalline substrate. For example, the fins can be etched from a wafer, such as a silicon wafer. At 827, a first source/drain region is formed in the substrate at the bottom of the fins. Because the fin is thin, the dopant is able to diffuse underneath the entire footprint of the fin. At 828, a surrounding gate insulator is formed around the fin; and at 829, surrounding gate is formed around and separated from the fin by surrounding the gate insulators. The resulting structure is backfilled with an insulator at 830. Trench(es) are etched and gate line(s) are formed adjacent to and in contact with the surrounding gate, as illustrated at 831. Some embodiments form two gate lines in contact with opposite sides of the surrounding gate. The gate lines can be oriented to contact the surrounding gate on a long side of the nanofin structure, or can be oriented to contact the surrounding gate on a short side of the nanofin structure. That is, the gate line(s) can be formed in the column or row directions. At 832, a second source/drain region is formed in a top portion of the fins, and contacts for the second source/drain regions are formed at 833.

Figure 9:
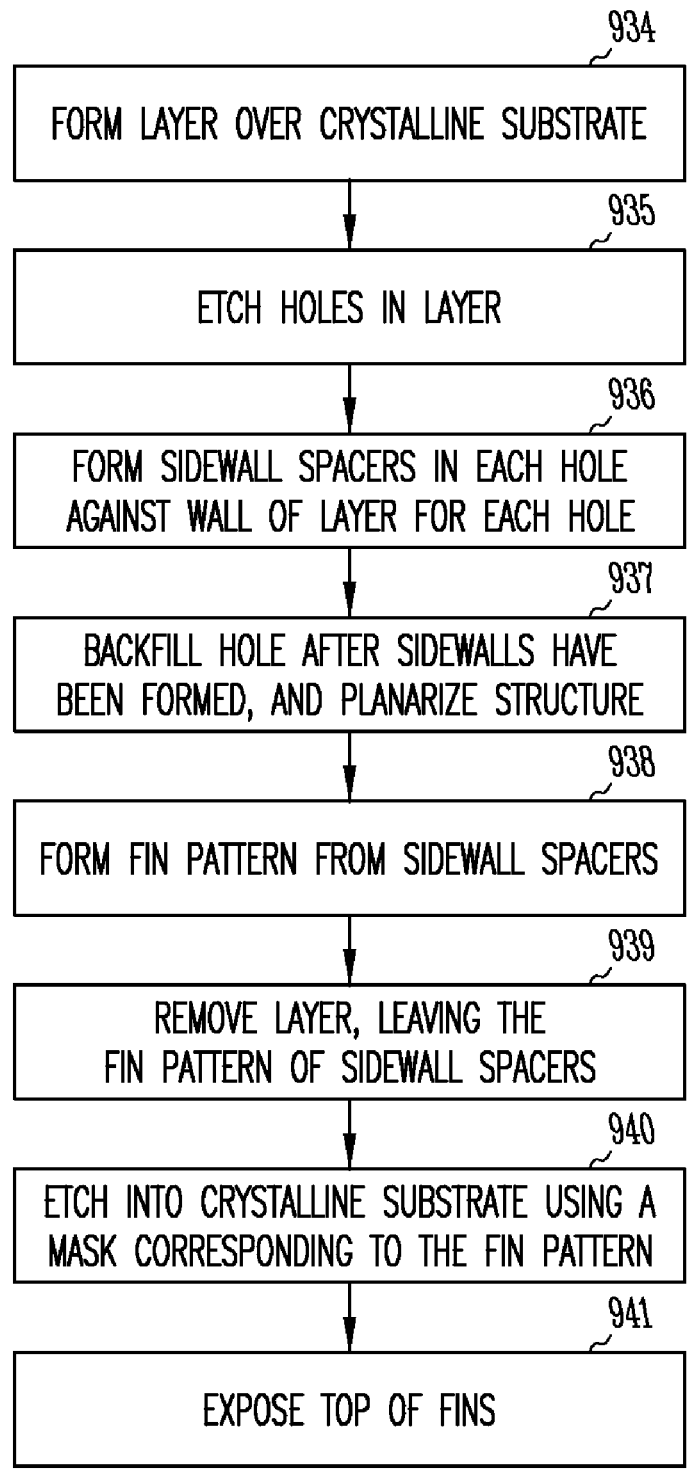
FIG. 9 illustrates a process to form a fin from a crystalline substrate, according to various embodiments of the present subject matter.

FIG. 9 illustrates a process to form a fin from a crystalline substrate, such as illustrated at 826 in FIG. 8, according to various embodiments of the present subject matter. A layer is formed over the crystalline substrate at 934, and holes are etched or otherwise formed in the layer at 935. In various embodiments, the layer formed over the crystalline substrate is a layer of amorphous silicon, with a layer of silicon nitride sandwiched between the crystalline substrate and the amorphous silicon, and a hole is etched to the layer of silicon nitride. At 936, sidewall spacers are formed in the hole against a wall of the layer that defines the periphery of the hole. Various embodiments oxidize the amorphous silicon layer to form the sidewall spacers. The hole is backfilled with the material of the first layer (e.g. a-silicon), and the structure is planarized at 937. In the embodiment illustrated in FIGS. 6B and 6C, the planarization removes the oxide on the top surface of the amorphous silicon, leaving a "racetrack" or rectangular pattern of oxide sidewall spacers. At 938, a fin pattern is formed from the sidewall spacers, such as may be realized using a mask and etch process, for example. In some embodiments, the resulting fin pattern has a first cross-section thickness in a first direction that corresponds to a minimum feature size, and a second cross-section thickness in a second direction orthogonal to the first that corresponds to the thickness of the oxide sidewalls and is significantly less than the minimum feature size. At 939, the layer (e.g. a-silicon) is removed, leaving the fin pattern of sidewall spacers. The crystalline substrate is etched at 940 using a mask corresponding to the fin pattern of sidewall spacers. Various embodiments etch the silicon nitride layer into fin pattern, and then use the silicon nitride layer to mask the crystalline substrate with the fin pattern when the substrate is etched. At 941, the mask layer (e.g. silicon nitride) is removed to expose the top of the etched fins.

Figure 10:
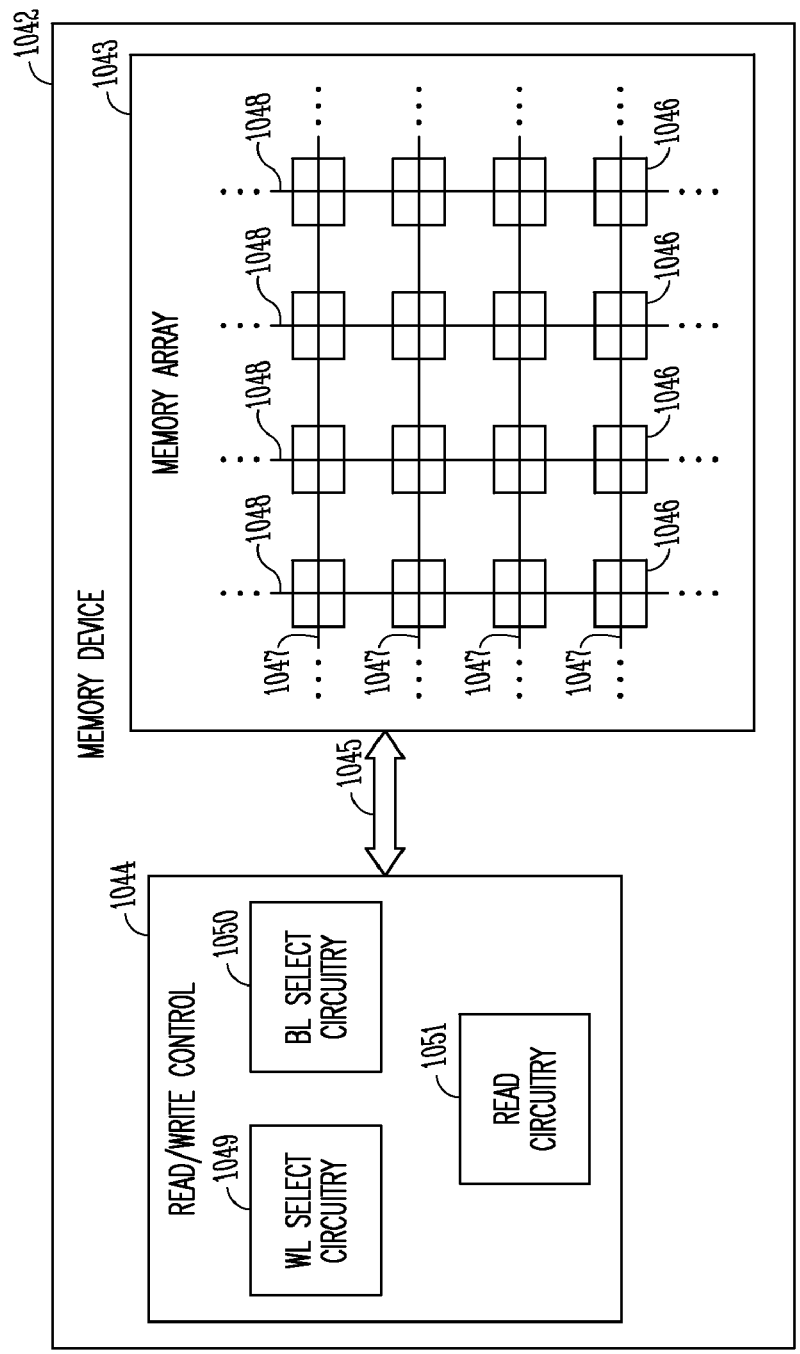
FIG. 10 is a simplified block diagram of a high-level organization of various embodiments of a memory device according to various embodiments of the present subject matter.

FIG. 10 is a simplified block diagram of a high-level organization of various embodiments of a memory device according to various embodiments of the present subject matter. The illustrated memory device 1042 includes a memory array 1043 and read/write control circuitry 1044 to perform operations on the memory array via communication line(s) or channel(s) 1045. The illustrated memory device 1042 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using etched nanofin transistors, as described above. The structure and fabrication methods for these devices have been described above.

The memory array 1043 includes a number of memory cells 1046. The memory cells in the array are arranged in rows and columns. In various embodiments, word lines 1047 connect the memory cells in the rows, and bit lines 1048 connect the memory cells in the columns. The read/write control circuitry 1044 includes word line select circuitry 1049 which functions to select a desired row, bit line select circuitry 1050 which functions to select a desired column, and read circuitry 1051, which functions to detect a memory state for a selected memory cell in the memory array 1043.

Figure 11:
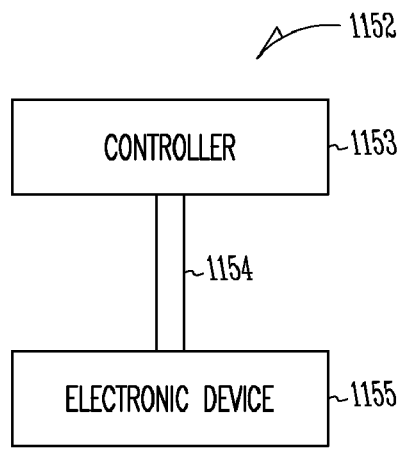
FIG. 11 illustrates a diagram for an electronic system having one or more nanofin transistors, according to various embodiments.

FIG. 11 illustrates a diagram for an electronic system 1152 having one or more nanofin transistors, according to various embodiments. Electronic system 1152 includes a controller 1153, a bus 1154, and an electronic device 1155, where the bus 1154 provides communication channels between the controller 1153 and the electronic device 1155. In various embodiments, the controller and/or electronic device include nanofin transistors as previously discussed herein. The illustrated electronic system 1152 may include, but is not limited to, information handling devices, wireless systems, telecommunication systems, fiber optic systems, electro-optic systems, and computers.

Figure 12:
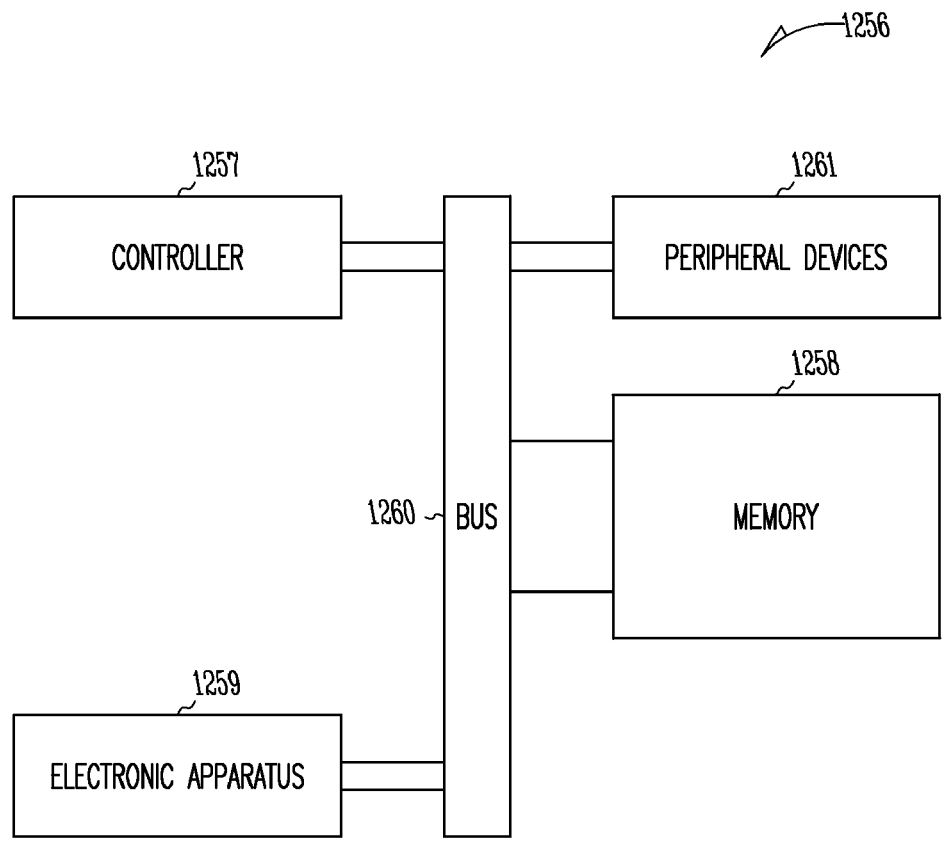
FIG. 12 depicts a diagram of an embodiment of a system having a controller and a memory.

FIG. 12 depicts a diagram of an embodiment of a system 1256 having a controller 1257 and a memory 1258. The controller and/or memory may include nanofin transistors according to various embodiments. The illustrated system 1256 also includes an electronic apparatus 1259 and a bus 1260 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1259 may be additional memory configured similar to memory 1258. An embodiment may include a peripheral device or devices 1261 coupled to the bus 1260. Peripheral devices may include displays, additional storage memory, or other control devices that may operate in conjunction with the controller and/or the memory. In an embodiment, the controller is a processor. Any of the controller 1257, the memory 1258, the electronic apparatus 1259, and the peripheral devices 1261 may include nanofin transistors according to various embodiments. The system 1256 may include, but is not limited to, information handling devices, telecommunication systems, and computers. Applications containing nanofin transistors as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The memory may be realized as a memory device containing nanofin transistors according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM). Various emerging memory technologies are capable of using transistors with the compressively-strained channels.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing and understanding the above description. The scope of the present subject matter should be determined with reference to the appended claims, along with the full scope of equivalents to which such claims are entitled.

What is claimed is:

1. A method for forming a transistor, comprising:
   forming a fin from a crystalline substrate, wherein forming the fin includes:
   depositing a material on the crystalline substrate;
   using a mask pattern with a minimum feature length to etch the material to define at least two holes in the material, wherein the material provides sidewalls that surround and define each of the at least two holes, and wherein each of the at least two holes is one minimum feature length (F) wide;
   forming sidewall spacers on each of the sidewalls that surround and define the at least two holes;
   forming a fin pattern from the sidewall spacers, wherein the fin pattern provides an array of sidewall spacers, wherein a first row and an adjacent second row has a center-to-center spacing of the minimum feature length (F) less a thickness of the fin ($\Delta T$), and the second row and an adjacent third row has a center-to-center spacing of the minimum feature length (F) plus the thickness of the fin ($\Delta T$); and
   using the fin pattern as a mask to etch the fin from the crystalline substrate,
   wherein the fin has a cross-sectional thickness in a first direction corresponding to the minimum feature length and a cross-sectional thickness in a second direction orthogonal to the first direction less than the minimum feature length, wherein the first direction is substantially parallel to a surface of the substrate and the second direction is substantially parallel to the surface of the substrate;

forming a first source/drain region in the substrate beneath the fin;

forming a surrounding gate insulator around the fin;

forming a surrounding gate around the fin and separated from the fin by the surrounding gate insulator; and forming a second source/drain region in a top portion of the fin.

2. The method of claim 1, wherein forming the fin from the crystalline substrate includes forming the fin from a crystalline silicon substrate.

3. The method of claim 1, wherein forming the first source/drain region in the substrate beneath the fin includes implanting a dopant in a trench adjacent to the substrate and diffusing the dopant underneath the fin.

4. The method of claim 3, wherein diffusing includes diffusing the dopant into a bottom portion of the fin.

5. The method of claim 1, wherein forming the surrounding gate insulator includes forming a silicon oxide.

6. The method of claim 1, wherein forming the surrounding gate includes forming a polysilicon gate.

7. The method of claim 1, further comprising recessing the surrounding gate such that the surrounding gate has a height less than a height of the fin.

8. The method of claim 1, further comprising forming a gate contact adjacent to and in contact with the surrounding gate.

9. The method of claim 1, further comprising forming at least one gate line adjacent to and in contact with the surrounding gate.

10. The method of claim 9, wherein forming the at least one gate line adjacent to and in contact with the surrounding gate includes forming a first gate line adjacent to and in contact with a first side of the surrounding gate and a second gate line adjacent to and in contact with a second side of the surrounding gate, the first and second sides being positioned on opposing sides of the fin.

11. The method of claim 9, wherein the fin has a rectangular footprint with a short side and a long side, wherein forming the at least one gate line adjacent to and in contact with the surrounding gate includes forming a gate line to contact the surrounding gate on the long side.

12. The method of claim 9, wherein the fin has a rectangular footprint with a short side and a long side, wherein forming at least one gate line adjacent to and in contact with the surrounding gate includes forming a gate line to contact the surrounding gate on the short side.

13. The method of claim 1, wherein forming the surrounding gate includes forming a polysilicon surrounding gate.

14. A method for forming a transistor, comprising:
etching a fin from a crystalline silicon substrate, wherein etching the fin from the crystalline substrate includes:
depositing a material on the crystalline substrate;
using a mask pattern with a minimum feature length to etch the material to define at least two holes in the material, wherein the material provides sidewalls that surround and define each of the at least two holes, and wherein each of the at least two holes is one minimum feature length (F) wide; and
forming sidewall spacers on each of the sidewalls that surround and define the at least two holes;
forming a fin pattern from the sidewall spacers, wherein the fin pattern provides an array of sidewall spacers, wherein a first row and an adjacent second row has a center-to-center spacing of the minimum feature length (F) less a thickness of the fin ($\Delta T$), and the second row and an adjacent third row has a center-to-center spacing of the minimum feature length (F) plus the thickness of the fin ($\Delta T$);

using the fin pattern as a mask to etch the fin,
wherein the fin has a cross-sectional thickness in a first direction corresponding to the minimum feature length and a cross-sectional thickness in a second direction orthogonal to the first direction less than the minimum feature length, and
wherein the first direction is substantially parallel to a surface of the substrate and the second direction is substantially parallel to the surface of the substrate;

forming a first source/drain region in the substrate beneath the fin;

forming a surrounding gate oxide around the fin;

forming a polysilicon surrounding gate around the fin and separated from the fin by the surrounding gate oxide; and forming a second source/drain region in a top portion of the fin.

15. The method of claim 14, wherein forming the surrounding gate oxide includes thermally oxidizing the silicon fin etched from the crystalline silicon substrate.

16. The method of claim 14, wherein etching the fin from the crystalline silicon substrate includes:
etching a hole in a layer over the substrate;
forming sidewall spacers in the hole;
forming a fin pattern from the sidewall spacers; and
etching into the crystalline substrate to form the fin from the substrate using a mask corresponding to the fin pattern.

17. A method for forming an array of transistors, comprising:
forming a nitride layer on a silicon wafer;
forming an amorphous silicon layer on the nitride layer;
patterning and etching at least two holes in the amorphous silicon layer, wherein patterning includes using a mask pattern with a minimum feature length to pattern the at least two holes and etching includes using the mask pattern to etch the at least two holes, wherein the amorphous silicon layer provides sidewalls that surround and define each of the at least two holes, and wherein each of the at least two holes is one minimum feature length (F) wide;
oxidizing the amorphous silicon layer, which results in oxide sidewall spacers on each of the sidewalls of the amorphous silicon layer that surround and define the at least two holes;
backfilling the at least two holes with amorphous silicon;
planarizing to expose oxide sidewalls;
patterning and etching the oxide sidewalls into a fin pattern, wherein the fin pattern provides an array of sidewall spacers, wherein a first row and an adjacent second row has a center-to-center spacing of the minimum feature length (F) less a thickness of the fin ($\Delta T$), and the second row and an adjacent third row has a center-to center spacing of the minimum feature length (F) plus a thickness of the fin ($\Delta T$);
removing the amorphous silicon;
etching the nitride layer, leaving a fin pattern of nitride beneath the fin pattern of oxide sidewalls;
etching the silicon wafer, using the fin pattern of nitride as a mask, to etch silicon fins from the silicon wafer, wherein each of the silicon fins has a cross-sectional thickness in a first direction corresponding to the minimum feature length and a cross-sectional thickness in a second direction orthogonal to the first direction less than the minimum feature length, wherein the first direction is substantially parallel to a surface of the silicon wafer and the second direction is substantially parallel to the surface of the silicon wafer;

implanting dopant and diffusing the dopant to form a conduction line beneath the etched silicon fins, the dopant providing first source/drain regions for the silicon fins;

forming a surrounding gate insulator on the silicon fins;

forming surrounding gates, wherein each surrounding gate is formed around and separated from one of the silicon fins by the surrounding gate insulator;

forming gate lines adjacent to and in contact with the surrounding gates for adjacent transistors in the array; and forming second source/drain regions for the silicon fins.

18. The method of claim 17, wherein forming the surrounding gate insulator includes thermally oxidizing the silicon fin etched from the crystalline silicon substrate.

19. The method of claim 17, wherein forming the surrounding gates includes forming polysilicon gates.

* * * * *

UNITED STATES PATENT AND TRADEMARK OFFICE
CERTIFICATE OF CORRECTION

PATENT NO. : 8,354,311 B2
APPLICATION NO. : 11/397358
DATED : January 15, 2013
INVENTOR(S) : Leonard Forbes It is certified that error appears in the above-identified patent and that said Letters Patent is hereby corrected as shown below:

In column 8, line 45, in Claim 1, before "using" insert -- forming a mask pattern and --.

In column 8, line 45, in Claim 1, after "using" delete "a" and insert -- the --, therefor.

In column 8, line 50, in Claim 1, delete "wide;" and insert -- wide and the at least two holes are separated by one minimum feature length (F); --, therefor.

In column 8, line 53, in Claim 1, after "wherein" insert -- forming --.

In column 8, line 54, in Claim 1, delete "provides" and insert -- includes forming --, therefor.

In column 8, line 55, in Claim 1, after "first row" insert -- of the array --.

In column 8, line 55, in Claim 1, after "second row" insert -- of the array --.

In column 8, line 58, in Claim 1, after "third row" insert -- of the array --.

In column 8, lines 58-59, in Claim 1, delete "centre-to centre" and insert -- centre-to-centre --, therefor.

In column 9, line 56, in Claim 14, before "using" insert -- forming a mask pattern and --.

In column 9, line 56, in Claim 14, after "using" delete "a" and insert -- the --, therefor.

In column 9, line 61, in Claim 14, delete "wide;" and insert -- wide and the at least two holes are separated by one minimum feature length (F); --, therefor.

In column 9, line 64, in Claim 14, after "wherein" insert -- forming --.

Signed and Sealed this
Second Day of April, 2013

Teresa Stanek Rea
*Acting Director of the United States Patent and Trademark Office*

CERTIFICATE OF CORRECTION (continued)
U.S. Pat. No. 8,354,311 B2

In column 9, line 65, in Claim 14, delete "provides" and insert -- includes forming --, therefor.

In column 9, line 66, in Claim 14, after "first row" insert -- of the array --.

In column 9, line 66, in Claim 14, after "second row" insert -- of the array --.

In column 10, line 2, in Claim 14, after "third row" insert -- of the array --.

In column 10, line 45, in Claim 17, delete "wide;" and insert -- wide and the at least two holes are separated by one minimum feature length (F); --, therefor.

In column 10, line 54, in Claim 17, after "first row" insert -- of the array --.

In column 10, line 54, in Claim 17, after "second row" insert -- of the array --.

In column 10, line 57, in Claim 17, after "third row" insert -- of the array --.

In column 10, line 57, in Claim 17, delete "centre-to centre" and insert -- centre-to-centre --, therefor.